United States Patent
Chiang

(10) Patent No.: US 7,454,307 B2
(45) Date of Patent: Nov. 18, 2008

(54) METHOD AND SYSTEM FOR DETECTING TILT OR SHIFT OF WAFER TRANSFERRED ONTO HOT PLATE IN REAL TIME, AND METHOD SYSTEM FOR MONITORING BAKING PROCESS OF WAFERS IN REAL TIME

(75) Inventor: Chih-Ming Chiang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/697,090

(22) Filed: Apr. 5, 2007

(65) Prior Publication Data

US 2008/0249735 A1    Oct. 9, 2008

(51) Int. Cl.
G06F 19/00    (2006.01)

(52) U.S. Cl. .......................................... 702/130; 374/6
(58) Field of Classification Search ................. 702/130, 702/182–185, 188; 374/1, 6
See application file for complete search history.

(56) References Cited

U.S. PATENT DOCUMENTS 6,954,275 B2 * 10/2005 Choi et al. ................... 356/614

* cited by examiner

Primary Examiner—Edward Raymond
(74) Attorney, Agent, or Firm—J.C. Patents

(57) ABSTRACT

A method for detecting a tilt or a shift of a wafer on a hot plate is described. A temperature variation of the hot plate is measured directly after the wafer is transferred onto the hot plate. The temperature variation is analyzed to determine whether or not a tilt or a shift of the wafer has occurred.

22 Claims, 4 Drawing Sheets

METHOD AND SYSTEM FOR DETECTING TILT OR SHIFT OF WAFER TRANSFERRED ONTO HOT PLATE IN REAL TIME, AND METHOD SYSTEM FOR MONITORING BAKING PROCESS OF WAFERS IN REAL TIME

BACKGROUND OF THE INVENTION

1. Field of Invention

This invention relates to an integrated circuit (IC) fabricating process, and more particularly to a method and a system for detecting a tilt or a shift of a wafer on a hot plate in real time, and to a method and a system for monitoring a baking process of a plurality of wafers in real time based on the former method and system.

2. Description of Related Art

As the linewidth of IC process is rapidly reduced, the uniformity issue of critical dimension (CD) gets more and more important. A factor affecting the CD uniformity of a wafer layer is the thickness uniformity of the photoresist layer to be patterned into a mask defining the wafer layer, because the depth of focus is constant in the exposure.

Except the topography of the wafer surface, the levelness of the wafer on the hot plate for bake-drying the coated photoresist liquid also affects the thickness uniformity of the resulting photoresist layer, because the photoresist liquid would flow before being sufficiently dried as the wafer is tilted.

FIG. 1 depicts, in a cross-sectional view, a hot plate and a wafer placed thereon in the prior art. A typical hot plate 10 is formed with a spacer 12 and a wafer guide 14 thereon, and a sensor 16 is usually installed thereto to monitor the temperature during the baking process. As a wafer 100 that is coated with a photoresist liquid is placed surrounded by the wafer guide 14 and contacting with the spacer 12, the surface of the wafer 100 is horizontal.

However, as shown in FIG. 2A/2B, when a large enough particle 200 is present on the hot plate 10 or when the wafer 100 has been inaccurately transferred onto the same, the wafer 100 is tilted degrading the thickness uniformity of the photoresist layer. Since thickness non-uniformity of a photoresist layer cannot be detected in real time in the prior art, the CD uniformity of a wafer tilted in the photoresist baking is possibly degraded causing failure of many dies on the wafer eventually. An inaccurate transfer of a wafer to a hot plate means a shift of the wafer on the hot plate hereinafter.

SUMMARY OF THE INVENTION

In view of the foregoing, the Inventor has found that the temperature variation of the hot plate in a certain period directly after a wafer is transferred onto same reflects the levelness of the wafer on the same. This invention is based on the discovery.

Accordingly, this invention provides a method for detecting a tilt or a shift of a wafer transferred onto a hot plate in real time, so as to prevent at least a thickness non-uniformity problem of the photoresist layer coated on wafer.

This invention also provides a method for monitoring a baking process of a plurality of wafers in real time, which is based on the above method for detecting a tilt or a shift of a wafer transferred onto a hot plate.

This invention further provides a system for detecting a tilt or a shift of a wafer transferred onto a hot plate in real time.

This invention further provides a system for monitoring a baking process of a plurality of wafers in real time, which is based on the system for detecting a tilt or a shift of a wafer transferred onto a hot plate.

The method for detecting a tilt or a shift of a wafer on a hot plate in real time of this invention is described below. A temperature variation of the hot plate is measured directly after the wafer is transferred onto the hot plate. The temperature variation is then analyzed to determine whether or not a tilt or a shift of the wafer has occurred.

In some embodiments of the above method, the step of analyzing the temperature variation includes deriving a temperature difference from the same and determining whether or not the temperature difference is within a normal range corresponding to a wafer state without a tilt or a shift.

In the method for monitoring a baking process of a plurality of wafers in real time of this invention, the wafers are one by one transferred to a hot plate to be heated. The method includes utilizing the above method for detecting a tilt or a shift of a wafer of this invention to detect a tilt or a shift of a wafer, and triggering an alarm once a tilt or a shift of a wafer is detected.

The system for detecting a tilt or a shift of a wafer transferred onto a hot plate in real time of this invention includes a first unit that measures a temperature variation of the hot plate directly after the wafer is transferred onto the hot plate, and a second unit connected with the first unit to receive the data of the temperature variation therefrom. The second unit analyzes the data of the temperature variation to determine whether or not a tilt or a shift of the wafer has occurred.

The system for monitoring a baking process of a plurality of wafers in real time of this invention includes an above system for detecting a tilt or a shift of a wafer on a hot plate in real time where the first unit includes a controller of the hot plate and the second unit includes an equipment application program (EAP) server and a statistical process control (SPC) system. The controller includes at least one sensor installed to the hot plate for measuring the temperature variation. The EAP server is connected with the controller, retrieving data of the temperature variation from the controller and calculating a temperature difference from the temperature variation. The SPC system is connected with the EAP server, retrieving data of the temperature difference from the EAP server and determining whether or not the temperature difference is in a normal range corresponding to a wafer state without a tilt or a shift.

Since a tilt or a shift of a wafer on a hot plate can be detected in real time with this invention, a wafer tilted or shifted on the hot plate can be picked up immediately. If the baking process is for drying the photoresist liquid on wafers, the tilted or shifted wafer detected in real time can be reworked for a new coating of photoresist liquid to prevent thickness non-uniformity of the photoresist layer and the CD non-uniformity.

In order to make the aforementioned and other objects, features and advantages of the present invention comprehensible, a preferred embodiment accompanied with figures is described in detail below.

DESCRIPTION OF EMBODIMENTS

It is first noted that the following embodiments are merely for further explaining this invention but are not intended to restrict the scope of this invention. For example, it is feasible to modify the algorithm for analyzing the temperature variation to produce two or more temperature parameters rather than one temperature difference and use a larger database recording the correlation between occurrence of a tilt and each of the temperature parameters to determine whether or not a wafer tilt has occurred.

First Embodiment

Figure 1:
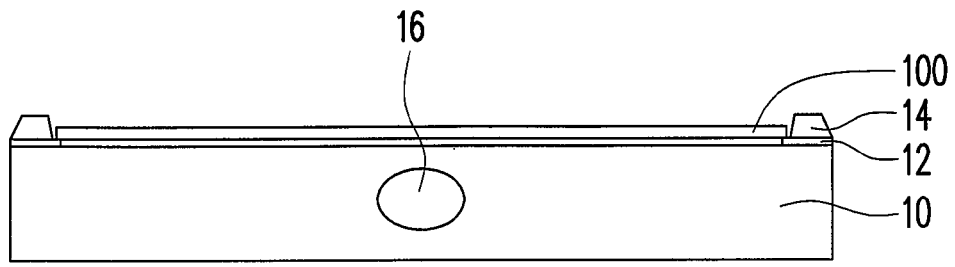
FIG. 1 depicts, in a cross-sectional view, a hot plate and a wafer placed thereon in the prior art.

In this embodiment, the above temperature variation is measured by one sensor installed to the hot plate, and the above temperature difference is the difference between the lowest value and a steady-state value in the curve of the temperature variation. A conventional one-sensor hot plate as shown in FIGS. 1-3 may be used, wherein the one sensor is positioned at or near the center of the hot plate. Such a one-sensor hot plate may be a so-called low hot plate (LHP).

Figure 4:
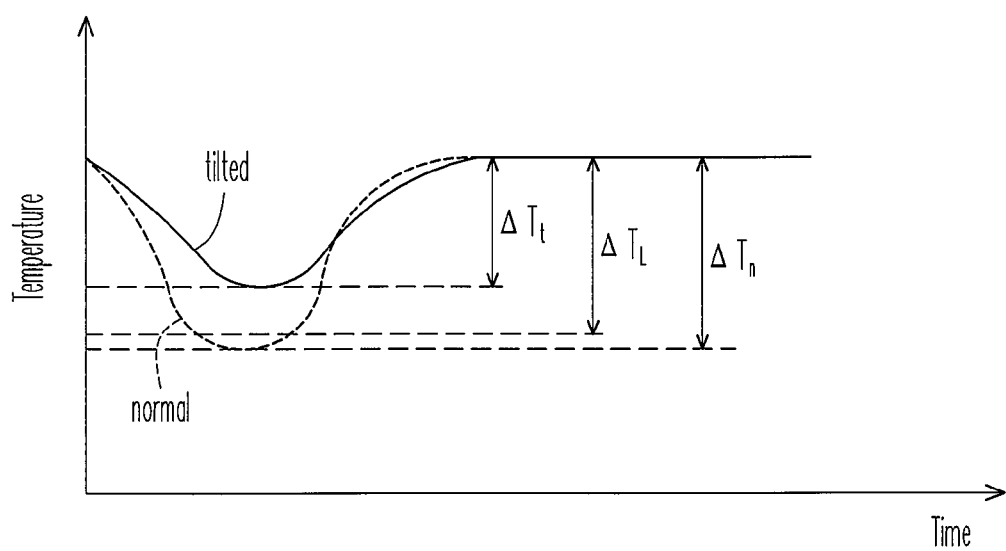
FIG. 4 shows typical temperature variation curves of a hot plate respectively for a non-tilted/shifted state and a tilted/shifted state of the wafer on the hot plate, according to a first embodiment of this invention that uses a one-sensor hot plate.

FIG. 4 shows typical temperature variation curves of a hot plate respectively for a non-tilted/shifted (normal) state and a tilted/shifted state of the wafer on the hot plate according to the first embodiment. Because the temperature of a wafer before being transferred onto the hot plate is lower than that of the hot plate, the temperature of the hot plate as measured by the sensor 16 is lowered by the wafer within a certain period directly after the wafer is transferred onto the hot plate.

Figure 2A:
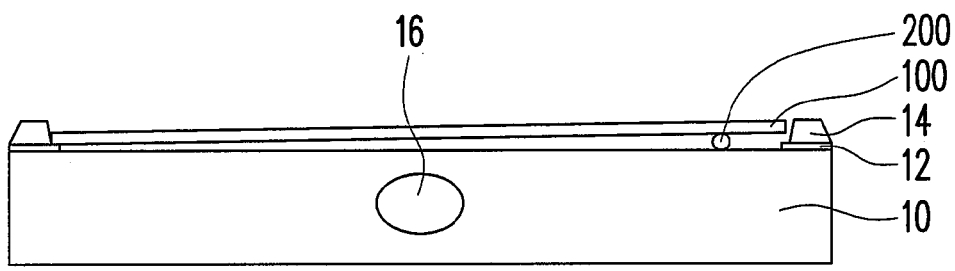
FIG. 2A/2B depicts a tilt of a wafer on the hot plate due to a particle/a positional shift of the wafer in the prior art.
Figure 2B:
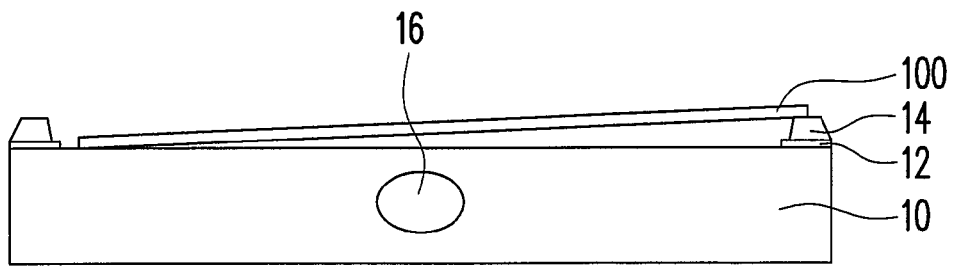
Figure 3:
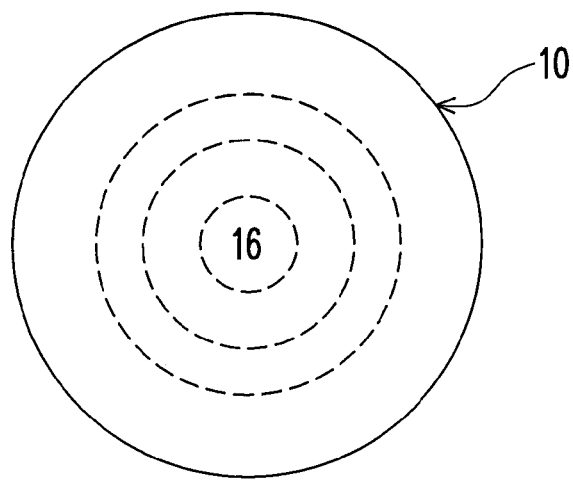
FIG. 3 shows, in a top view, the position of the one temperature sensor in a one-sensor hot plate in the prior art.

Referring to FIGS. 1 and 2A/2B, when the wafer 100 is placed accurately in a horizontal state, the distance between the wafer 100 and the sensor 16 is relatively smaller; when the wafer 100 is tilted because of a particle or a previous transfer error, said distance is relatively larger. Hence, the temperature drop "$\Delta T_n$" of the hot plate with a wafer accurately placed thereon, which is defined as the difference between the lowest value and a steady-state value in the corresponding temperature variation curve, is larger than that ($\Delta T_t$) of the hot plate with a tilted wafer thereon. Thus, whether or not a wafer tilt has occurred on the hot plate can be determined with said temperature difference derived from the temperature variation curve measured by the one sensor.

More specifically, in real practice of the above embodiment, the variations in the conditions of the heater, the sensor and so forth should also be considered. Hence, a statistical process control (SPC) system is often included in the baking monitor system to determine a normal range of the temperature difference corresponding to a wafer state without a tilt or a shift. For example, the SPC system may determine a lower limit "$\Delta T_L$" for the normal range. When the temperature difference derived is less than $\Delta T_L$, the wafer is determined to be tilted. When the temperature difference derived is more than $\Delta T_L$, the wafer is determined to be in a horizontal state.

Once a tilt or a shift of a wafer is detected in a baking process of a plurality of wafers wherein the wafers are one by one transferred to the hot plate to be heated, an alarm can be triggered. It is also possible to simultaneously stop the baking process by stopping the transfer of the wafers or by stopping the heating of the hot plate.

Second Embodiment

Figure 5:
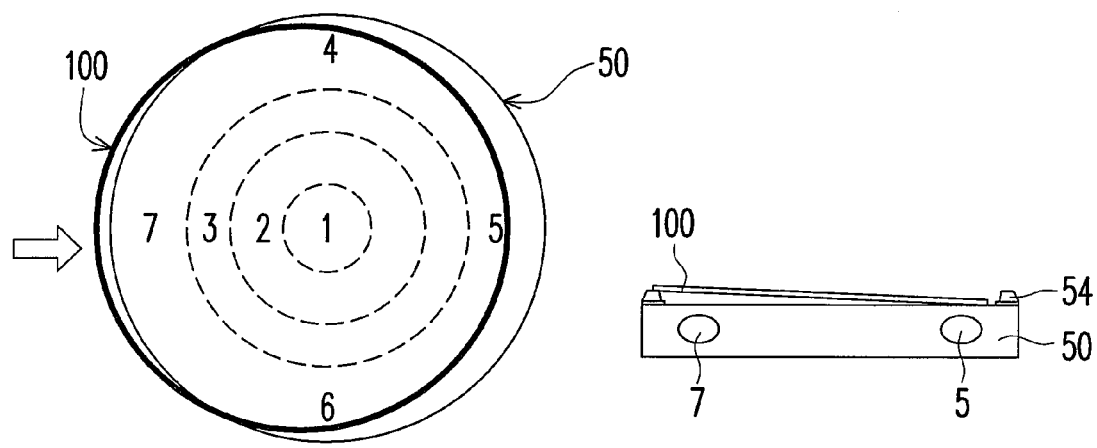
FIG. 5 shows, in a top view, the positions of the multiple temperature sensors in a multi-sensor hot plate in the prior art.

In this embodiment, the above temperature variation is measured by two sensors installed to the hot plate, and the above temperature difference is the difference between the lowest value in the temperature variation curve measured by one sensor and that in the temperature variation curve measured by the other sensor. A conventional multi-sensor hot plate (50) as shown in FIG. 5 may be used. Such a multi-sensor hot plate 50 may be a so-called precision hot plate (PHP) equipped with seven sensors 1-7, wherein the two sensors 4 and 6 are located at two opposite edge portions of the hot plate 50, and the two sensors 5 and 7 are located at the other two opposite edge portions of the hot plate 50.

As a wafer 100 is transferred in the direction from the sensor 7 to the sensor 5 (or in the reverse direction) so that the two sensors 5 and 7 are arranged substantially in the transfer direction of the wafer 100, the wafer 100 is most possibly lifted by the wafer guide 54 at the side of the sensor 7 or 5 for an imprecise movement of the robot used to transfer the wafer 100. When the wafer is lifted by the wafer guide 54 at the side of the sensor 7, for example, the distance between the sensor 7 and the wafer 100 is larger than that between the sensor 5 and the wafer 100.

Figure 6:
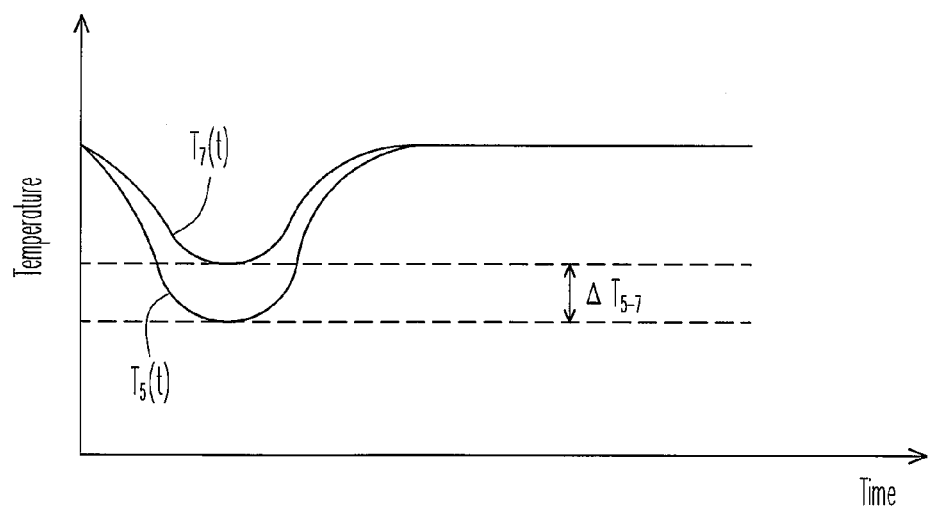
FIG. 6 shows typical temperature variation curves of a hot plate measured by the two sensors at two preferred locations of the hot plate as the wafer is tilted, according to a second embodiment of this invention that uses a multi-sensor hot plate.

Thus, as shown in FIG. 6, the lowest value in the temperature variation curve "$T_5(t)$" measured by the sensor 5 is lower than that in the temperature variation curve "$T_7(t)$" measured by the sensor 7. Accordingly, whether or not a tilt or a shift of the wafer 100 has occurred on the hot plate 50 can be determined based on the difference between respective lowest temperatures in the two temperature variation curves measured by the sensors 5 and 7, respectively. It is noted that the lowest value in the temperature variation curve measured by the sensor 4 or 6 that is closer to the wafer 100 than the sensor 7 but farther than the sensor 5 is between the above two locally lowest temperatures measured by the sensors 5 and 7, and is therefore not preferred to use in the monitor method of this embodiment.

Moreover, as in the case of the first embodiment, the variations in the measuring system may sometimes cause the locally lowest temperatures measured by the sensor 5 and the sensor 7 respectively to be slightly different even when the wafer is horizontally placed. Hence, inclusion of a statistical process control (SPC) system is still preferred in the second embodiment as being capable of determining a normal range of the above temperature difference corresponding to a wafer state without a tilt or a shift. The normal range should be centered approximately at zero.

Though it is the temperature difference between the lowest value and the steady-state value in one temperature variation curve or between respective lowest values in two temperature variation curves that servers only one temperature parameter for tilt determination in the first and second embodiments, this invention is not limited to use only one temperature parameter. For example, it is possible to utilize the three sensors 1, 5 and 7 in the hot plate 50 of FIG. 5 to produce first to third temperature variation curves respectively and then determine the wafer state based on both of the temperature difference derived from the first temperature variation curve as in the first embodiment and that from the second and third temperature variation curves as in the second embodiment. Alternatively, multiple temperature parameters including or other than said two temperature differences are derived from three or more sensors, and a larger database is used accordingly to determine whether the wafer is tilted or shifted.

Third Embodiment

Figure 7:
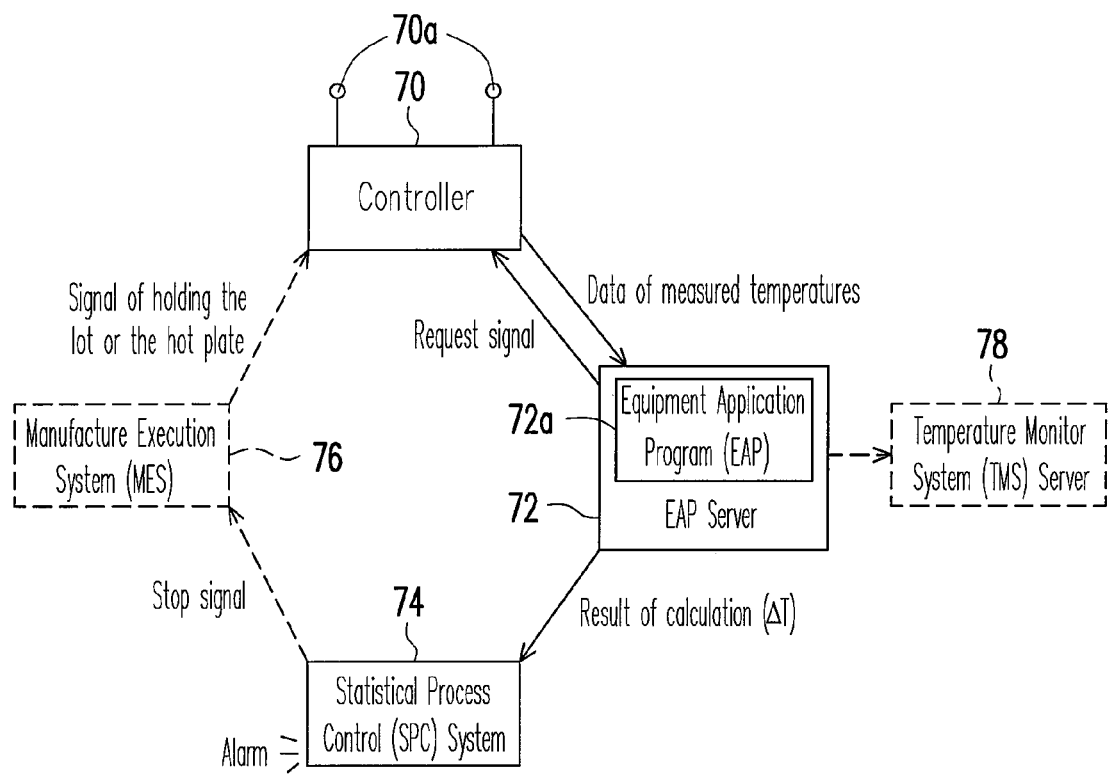
FIG. 7 shows a system for monitoring a baking process of a plurality of wafers in real time according to a third embodiment of this invention.

FIG. 7 shows a system for monitoring a baking process of a plurality of wafers in real time according to the third embodiment of this invention. The real-time monitor system includes at least a controller 70 of the hot plate, an equipment application program (EAP) server 72 connected with the controller 70, and a statistical process control (SPC) system 74 connected with the EAP server 72.

The controller 70 includes one or more temperature sensors 70a installed to the hot plate. The EAP server 72 is controlled by an equipment application program 72a, and may be controlled to output a request signal to the controller 70 for the data of the measured temperatures. After receiving the request signal from the EAP server 72, the controller 70 transfers the data of the temperature variation measured by the sensor(s) 70a to the EAP server 72, which then analyzes the temperature data as follows.

When the monitor method described in the first embodiment is adopted, the EAP server 72 determines the lowest value and the steady-state value in the one temperature variation curve and then calculates their difference. When the monitor method in the second embodiment is adopted, the EAP server 72 determines respective lowest values in the two temperature variation curves respectively measured by two sensors and then calculates their difference. The EAP server 72 then outputs the result of the calculation, i.e., the temperature difference ($\Delta T$), to the SPC system 74.

Before receiving the data of the temperature difference from the EAP server 72, the SPC system 74 may have determined, based on the statistics of the same baking process conducted before, a normal range of the temperature difference corresponding to a wafer state without a tilt or a shift. The SPC system 74 then determines whether or not a tilt or a shift of the wafer has occurred by determining whether or not the above-derived temperature difference is within the normal range.

If the SPC system 74 determines that a tilt or a shift of the wafer has occurred, it may trigger an alarm only to inform the operator to check and stop the baking process manually, or may trigger an alarm and simultaneously output a stop signal for stopping the baking process automatically. The stop signal may be transmitted to a manufacture execution system (MES) 76, which then outputs a signal of holding the wafer lot or the hot plate to stop the transfer of the wafers or stop the heating of the hot plate.

Thereafter, the tilted wafer can be picked up and subjected to a rework process, which may include washing out the photoresist coating on the wafer and forming a new one on the same. In addition, the above baking monitor system may further includes a temperature monitor system (TMS) server 78, which is connected with the EAP server 72 for storing the data of the measured temperatures. Because the data storage is not necessary in real time, it is feasible that the EAP server 72 outputs temperature data to the TMS server 78 once per hour.

Accordingly, by using this invention to a baking process for drying photoresist coatings on wafers, a tilted or shifted wafer can be detected in real time. The tilted or shifted wafer can be reworked for a new coating of photoresist liquid to prevent non-uniformity of the critical dimension.

This invention has been disclosed above in the preferred embodiments, but is not limited to those. It is known to persons skilled in the art that some modifications and innovations may be made without departing from the spirit and scope of the present invention. Hence, the scope of this invention should be defined by the claims.

What is claimed is:

1. A method for detecting a tilt or a shift of a wafer transferred onto a hot plate in real time, comprising:
   measuring a temperature variation of the hot plate directly after the wafer is transferred onto the hot plate; and
   analyzing the temperature variation to determine whether or not a tilt or a shift of the wafer has occurred.

2. The method of claim 1, wherein analyzing the temperature variation comprises deriving a temperature difference from the temperature variation and then determining whether or not the temperature difference is within a normal range corresponding to a wafer state without a tilt or a shift.

3. The method of claim 2, wherein the temperature variation is measured by one sensor installed to the hot plate, and the temperature difference is a difference between the lowest value and a steady-state value in a curve of the temperature variation.

4. The method of claim 3, wherein the one sensor is located at or near a center of the hot plate.

5. The method of claim 2, wherein the temperature variation is measured by two sensors installed to two locations of the hot plate, and the temperature difference is a difference between respective lowest values of two temperature variation curves that are respectively measured by the two sensors.

6. The method of claim 5, wherein the two sensors are arranged substantially in a transfer direction of the wafer.

7. The method of claim 6, wherein the two sensors are located at two opposite edge portions of the hot plate along the transfer direction of the wafer.

8. The method of claim 1, wherein a tilt of the wafer is caused by a particle or a transfer error.

9. A method for monitoring a baking process of a plurality of wafers in real time, wherein the wafers are one by one transferred to a hot plate to be heated, comprising:
   utilizing the method of claim 1 to detect a tilt or a shift of a wafer; and
   triggering an alarm once a tilt or a shift of a wafer is detected.

10. The method of claim 9, further comprising stopping the baking process once a tilt or a shift of a wafer is detected.

11. The method of claim 10, wherein stopping the baking process comprises stopping the transfer of the wafers or stopping the heating of the hot plate.

12. A system for detecting a tilt or a shift of a wafer transferred onto a hot plate in real time, comprising:
   a first unit that measures a temperature variation of the hot plate directly after the wafer is transferred onto the hot plate; and
   a second unit connected with the first unit to receive data of the temperature variation therefrom, which analyzes the data of the temperature variation to determine whether or not a tilt or a shift of the wafer has occurred.

13. The system of claim 12, wherein the first unit comprises a controller of the hot plate that includes at least one sensor installed to the hot plate for measuring the temperature variation.

14. The system of claim 13, wherein the second unit comprises:

an equipment application program (EAP) server connected with the controller, which retrieves the data of the temperature variation from the controller and calculates a temperature difference from the temperature variation; and a statistical process control (SPC) system connected with the EAP server, which retrieves data of the temperature difference from the EAP server and determines whether or not the temperature difference is within a normal range corresponding to a wafer state without a tilt or a shift.

15. The system of claim 14, wherein the temperature variation is measured by one sensor, and the temperature difference is a difference between the lowest value and a steady-state value in a curve of the temperature variation.

16. The system of claim 15, wherein the one sensor is located at or near a center of the hot plate.

17. The system of claim 14, wherein the temperature variation is measured by two sensors, and the temperature difference is a difference between respective lowest values of two temperature variation curves that are respectively measured by the two sensors.

18. The system of claim 17, wherein the two sensors are arranged substantially in a transfer direction of the wafer.

19. The system of claim 18, wherein the two sensors are located at two opposite edge portions of the hot plate along the transfer direction of the wafer.

20. A system for monitoring a baking process of a plurality of wafers in real time, wherein the wafers are one by one transferred to a hot plate to be heated, comprising:

a system for detecting a tilt or a shift of a wafer on a hot plate as described in claim 14, wherein the SPC system also triggers an alarm once a tilt or a shift of a wafer is detected.

21. The system of claim 20, wherein the SPC system further causes the baking process to be stopped once a tilt or a shift of a wafer is detected.

22. The system of claim 21, further comprising a manufacture execution system (MES) connected between the SPC system and the controller, wherein once a tilt or a shift of a wafer is detected, the SPC system outputs a stop signal to the MES and then the MES commands the controller to stop the transfer of the wafers or to stop the heating of the hot plate.

* * * * *